United States Patent
Lee et al.

(10) Patent No.: US 7,642,540 B2
(45) Date of Patent: Jan. 5, 2010

(54) PHASE CHANGE RANDOM ACCESS MEMORY AND METHOD OF OPERATING THE SAME

(75) Inventors: Sang-mock Lee, Gyeonggi-do (KR); Yoon-ho Khang, Gyeonggi-do (KR); Jin-seo Noh, Seoul (KR); Dong-seok Suh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 518 days.

(21) Appl. No.: 11/359,428

(22) Filed: Feb. 23, 2006

(65) Prior Publication Data
US 2007/0051935 A1  Mar. 8, 2007

(30) Foreign Application Priority Data
Sep. 13, 2005  (KR) .................. 10-2005-0085250

(51) Int. Cl.
*H01L 47/00* (2006.01)
(52) U.S. Cl. .................. 257/4; 257/5; 257/E45.002
(58) Field of Classification Search .................. 257/4, 257/5, E45.002, E51.04, E27.104, E29.17; 365/148
See application file for complete search history.

(56) References Cited

U.S. PATENT DOCUMENTS

| 6,617,192 B1 | 9/2003 | Lowrey et al. | |
| 7,166,533 B2 * | 1/2007 | Happ | 438/637 |
| 7,348,590 B2 * | 3/2008 | Happ | 257/4 |
| 2004/0246804 A1 * | 12/2004 | Cho et al. | 365/225.7 |
| 2005/0006681 A1 * | 1/2005 | Okuno | 257/295 |
| 2005/0037204 A1 * | 2/2005 | Osiander et al. | 428/408 |
| 2006/0049447 A1 * | 3/2006 | Lee et al. | 257/314 |

OTHER PUBLICATIONS

Office Action for corresponding Korean Application No. 10-2005-0085250 dated Sep. 29, 2006.
The 3$^{rd}$ International Nanotech Symposium, "NT Challenge, Science and Technology for Next Era," Aug. 24-26, 2005, KINTEX-Ilsan, Korea.

* cited by examiner

*Primary Examiner*—Minh-Loan T Tran
(74) *Attorney, Agent, or Firm*—Harness, Dickey & Pierce, P.L.C (57) ABSTRACT

A phase change random access memory (PRAM), and a method of operating the PRAM are provided. In the PRAM comprising a switching element and a storage node connected to the switching element, the storage node comprises a first electrode, a second electrode, a phase change layer between the first electrode and a second electrode, and a heat efficiency improving element formed between the first electrode and the phase change layer. The heat efficiency improving element may be one of a carbon nanotube (CNT) layer, a nanoparticle layer, and a nanodot layer, and the nanoparticle layer may be a fullerene layer.

12 Claims, 5 Drawing Sheets

PHASE CHANGE RANDOM ACCESS MEMORY AND METHOD OF OPERATING THE SAME

PRIORITY STATEMENT

This application claims the benefit of Korean Patent Application No. 10-2005-0085250, filed on Sep. 13, 2005, in the Korean Intellectual Property Office, the disclosure of which is incorporated herein in its entirety by reference.

BACKGROUND OF THE INVENTION

1. Field of the Invention

Example embodiments of the present invention relate to a semiconductor memory device and a method of operating the same, and more particularly, to a phase change random access memory (PRAM) and a method of operating the same.

2. Description of the Related Art

A phase change layer of a phase change random access memory (PRAM), in which data is recorded, has a crystal structure or an amorphous structure depending on a heating temperature and a cooling speed. When the phase change layer has a crystal structure, a resistance of the PRAM is low, and when the phase change layer has an amorphous structure, a resistance of the PRAM is high. A PRAM is a nonvolatile memory device capable of recording and reading data using the resistance characteristic.

A problem occurring in a conventional PRAM is that a reset current $I_{reset}$ necessary to change the phase change layer into an amorphous structure is high.

In order to increase an integration density of a typical PRAM comprising a storage node including a phase change layer in one cell, and one transistor, respective sizes of the storage node and the transistor must be reduced.

However, when the size of the transistor is reduced, because a maximum current allowed in the transistor is reduced, if a reset current is higher than the maximum current of the transistor, data storage using the phase change characteristic may be impossible. Therefore, it is difficult to increase an integration density of a PRAM without a reduction of the reset current of the PRAM.

SUMMARY OF THE INVENTION

Example embodiments of the present invention provide a phase change random access memory (PRAM) comprising a heat efficiency improving element and a method of operating such a PRAM.

Example embodiments of the present invention provide a phase change random access memory (PRAM) comprising a heat efficiency improving element capable of decreasing a reset current $I_{reset}$.

Example embodiments of the present invention also provide a method of operating a PRAM including a heat efficiency improving element capable of decreasing a reset current $I_{reset}$.

According to an example embodiment of the present invention, there is provided a PRAM comprising a storage node connected to a switching element, in which the storage node comprises a first electrode, a phase change layer, a heat efficiency improving element formed between the first electrode and the phase change layer, and/or a second electrode.

In an example embodiment, the heat efficiency improving element may be one of a carbon nanotube (CNT) layer, a nanoparticle layer, and a nanodot layer.

In an example embodiment, the heat efficiency improving element may comprise at least two layers, which are sequentially stacked.

In an example embodiment, the nanoparticle layer may be a fullerene layer. In an example embodiment, the fullerene layer may include hollow spheres, ellipsoids, and/or tubes of carbon.

In an example embodiment, the nanoparticle layer or the nanodot layer may be composed of at least one of a silicon compound, a carbon compound, an oxygen compound (for example, an oxide), and a nitrogen compound.

In an example embodiment, the fullerene layer may be one of a C60 layer, a C70 layer, a C76 layer, a C78 layer, and a C84 layer. In an example embodiment, the fullerene layer may be a metal endohedral layer comprising metal atoms thereinside. In an example embodiment, the metal atom may be at least one of La, Er, Gd, Ho, and Nd.

In an example embodiment, the heat efficiency improving element may extend over an entire surface of the phase change layer. In an example embodiment, the heat efficiency improving element may extend to a portion of a surface of the phase change layer.

In an example embodiment, the storage node may further comprise a first electrode contact layer formed on the first electrode, and the heat efficiency improving element may be disposed in contact with the first electrode contact layer.

In an example embodiment, the heat efficiency improving element may be disposed on a portion of the first electrode contact layer, and another portion of the first electrode contact layer may be in contact with an insulating layer.

In an example embodiment, the heat efficiency improving element may be disposed inside the first electrode contact layer, a depth downward from the upper surface of the first electrode contact layer, and may contact the phase change layer.

In an example embodiment, the storage node may comprise a plurality of layers and each of the plurality of layers may comprise the heat efficiency improving element and the phase change layer which form one pair. In an example embodiment, the uppermost layer of the plurality of layers is the heat efficiency improving element.

According to another example embodiment of the present invention, there is provided a method of operating a PRAM including a switching element and a storage node connected to the switching element, in which the storage node includes a first electrode, a phase change layer, a heat efficiency improving element formed between the first electrode and the phase change layer, and/or a second electrode, and the method comprises maintaining the switching element in an ON state, and applying a current to the storage node.

In an example embodiment, the current may be one of a reset current, a set current, and a read current.

In an example embodiment, after applying the reset current, the method may further comprise applying a set current to the storage node for a longer time than a time for which the reset current is applied.

In an example embodiment, when the current is the read current, the read current may be applied so as to measure a resistance of the storage node, and compare the measured resistance to a reference resistance.

In an example embodiment, the heat efficiency improving element may be one of a carbon nanotube (CNT) layer, a nanoparticle layer, and a nanodot layer.

In an example embodiment, the heat efficiency improving element may comprise at least two layers which are sequentially stacked.

In an example embodiment, the nanoparticle layer may be a fullerene layer. In an example embodiment, the fullerene layer may include hollow spheres, ellipsoids, and/or tubes of carbon. In an example embodiment, the nanoparticle layer or the nanodot layer may be composed of at least one of a silicon compound, a carbon compound, an oxygen compound (for example, an oxide), and a nitrogen compound. In an example embodiment, the fullerene layer may be one of a C60 layer, a C70 layer, a C76 layer, a C78 layer, and a C84 layer.

In an example embodiment, the fullerene layer may be a metal endohedral layer comprising metal atoms thereinside. In an example embodiment, the metal atom may be of a Lanthanide group comprising at least one of La, Er, Gd, Ho, and Nd.

In an example embodiment, the heat efficiency improving element may extend to an entire surface of the phase change layer. In an example embodiment, the heat efficiency improving element may extend to a portion of a surface of the phase change layer.

In an example embodiment, the storage node may further comprise a first electrode contact layer formed on the first electrode, and the heat efficiency improving element may be disposed in contact with the first electrode contact layer.

In an example embodiment, the heat efficiency improving element may be disposed in contact with the first electrode contact layer, and another portion of the upper surface of the first electrode contact layer may be in contact with an insulating layer.

In an example embodiment, the heat efficiency improving element may be disposed inside the first electrode contact layer, a depth downward from the upper surface of the first electrode contact layer, and may contact the phase change layer.

In an example embodiment, the heat efficiency improving element and the phase change layer of the storage node may form a plurality of layers as one pair, and a last layer may be the heat efficiency improving element.

As described above, according to example embodiments of the present invention, a reset current of a PRAM can be decreased. That is, a current, which passes the phase change layer of the PRAM, passes through the heat efficiency improving element, a temperature of a portion of the phase change layer in contact with the heat efficiency improving element becomes a melting point of the phase change layer or higher even at a current lower than that of a conventional case due to a high resistivity and a low heat conductivity of the heat efficiency improving element, the portion of the phase change layer in contact with the heat efficiency improving element may become amorphous.

BRIEF DESCRIPTION OF THE DRAWINGS

The above and other features and advantages of example embodiments of the present invention will become more apparent by describing in detail exemplary embodiments thereof with reference to the attached drawings in which.

DETAILED DESCRIPTION OF EXAMPLE EMBODIMENTS OF THE INVENTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout the figures. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes", "comprises", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of example embodiments (and intermediate structures) of the present invention. As such, variations from the shapes of the illustrations as a result, of manufacturing techniques and/or tolerances, for example, are to be expected. Thus, example embodiments of the present invention should not be construed as limited to the particular shapes of regions illustrated herein and are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation, for example, may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail by explaining example embodiments of the invention with reference to the attached drawings. In the drawings, the thicknesses of layers and regions are exaggerated for clarity.

A phase change random access memory (PRAM) having a heat efficiency improving element and a method of operating the same according to example embodiments of the present invention will be now described more fully hereinafter with reference to the accompanying drawings. In the drawings, the thicknesses of layers and regions are exaggerated for clarity.

Figure 1:
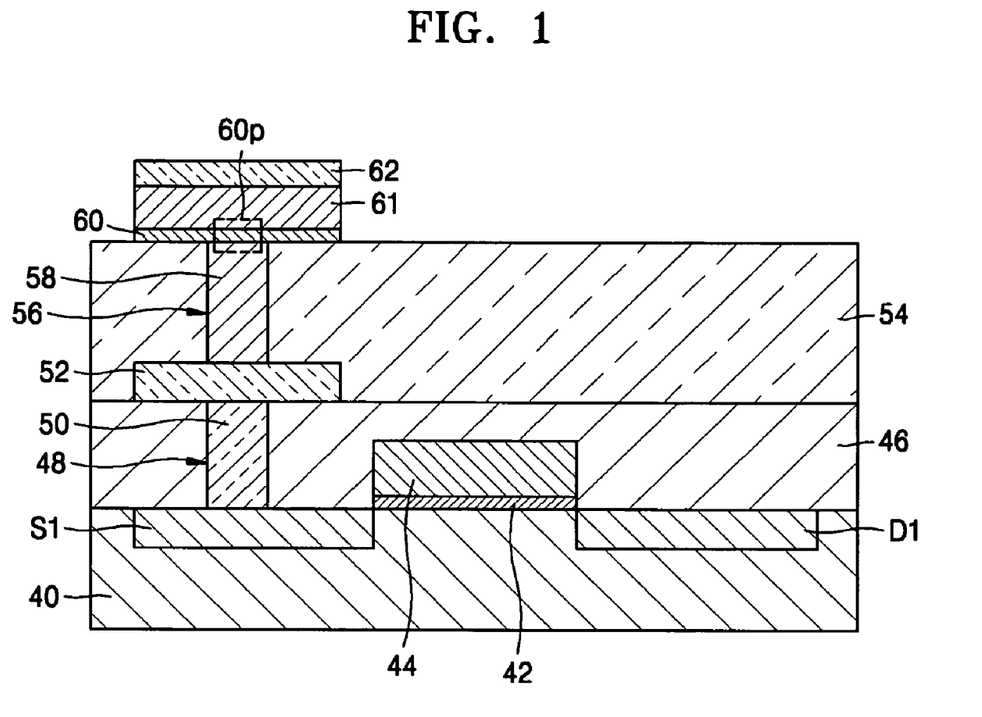
FIG. 1 is a sectional view illustrating a phase change random access memory (PRAM) according to an example embodiment of the present invention.

FIG. 1 is a sectional view illustrating a phase change random access memory (PRAM) (hereinafter, a first PRAM) according to an example embodiment of the present invention. Referring to FIG. 1, first and second impurity regions S1 and D1 doped with conductive impurities, for example, n-type impurities may be disposed in a substrate 40 of the first PRAM. The first and second impurity regions S1 and D1 may be separated from each other by a distance.

The substrate 40 may be, for example, a p-type silicon substrate. The first and second impurity regions S1 and D1 may have various shapes. One of the first and second impurity regions S1 and D1, for example, the first impurity region S1 may be a source region, and the second impurity region D1 region may be a drain region. A gate oxide layer 42 may be disposed on the substrate 40 between the first and second impurity regions SI and D1, and a gate 44 may be disposed on the gate oxide layer 42. The substrate 40, the first and second impurity regions S1 and D1, and the gate 44 together may form a field effect transistor. In an example embodiment, the field effect transistor may be replaced with a PN junction diode.

A first interlayer insulating layer 46 covering the field effect transistor may be formed on the substrate 40. A contact hole 48 exposing the first impurity region S1 may be formed in the first interlayer insulating layer 46. In an example embodiment, the contact hole 48 may be disposed at a position exposing the second impurity region D1 instead of the first impurity region S1. The contact hole 48 may be filled with a conductive plug 50. A lower electrode 52 may be disposed on the first interlayer insulating layer 46 to cover an exposed upper surface of the conductive plug 50. The lower electrode 52 may also function as a pad layer. A second interlayer insulating layer 54 may be disposed on the first interlayer insulating layer 46 to cover the lower electrode 52, and a contact hole 56 may be formed in the second interlayer insulating layer 54 to expose an upper surface of the lower electrode 52. The second interlayer insulating layer 54 may be formed of the same material as that of the first interlayer insulating layer 46. The contact hole 56 may be filled with a lower electrode contact layer 58. A heat efficiency improving element 60, for example, a carbon nanotube (CNT) layer, a nanoparticle layer, and/or a nanodot layer, may be disposed on the second interlayer insulating layer 54 to cover an upper surface of the lower electrode contact layer 58. A phase change layer 61 and an upper electrode 62 may be sequentially stacked on the heat efficiency improving element 60. The phase change layer 61 may be, for example, a GST layer.

In an example embodiment, the phase change layer 61 may include a chalcogenide.

For example, the phase change layer 61 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change layer 61 may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change layer 61 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change layer 61 is described above as being formed primarily of ternary phase-change chalcogenide alloys, the chalcogenide alloy of the phase change layer 61 could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the phase change layer 61 may be made of a transition metal oxide having multiple resistance states, as described above. For example, the phase change layer 61 may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$).

The lower electrode 52, the lower electrode contact layer 58, the fullerene layer 60, the phase change layer 61, and the upper electrode 62 may constitute a storage node storing bit data. In an example embodiment, the fullerene layer 60 may include hollow spheres, ellipsoids, and/or tubes of carbon. In an example embodiment, the lower electrode 52 may directly contact the heat efficiency improving element 60, and the lower electrode contact layer 58 may be removed from the storage node.

Figure 2:
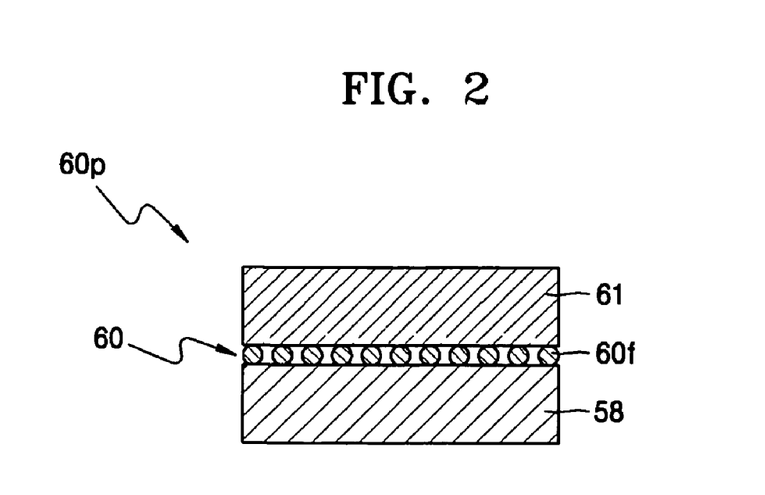
FIG. 2 is an enlarged sectional view illustrating a partial portion of a lower electrode contact layer, a fullerene layer, and a phase change layer of FIG. 1.

FIG. 2 is an enlarged view illustrating a portion 60p partially including the lower electrode contact layer 58, the heat efficiency improving element 60, and the phase change layer 61 of FIG. 1.

Referring to FIG. 2, the heat efficiency improving element 60 may be a single layer, and may include a plurality of fullerenes 60f. A resistance of the structure measured when a current passes through the fullerene layer 60 is high compared to a resistance measured in the structure formed without a fullerene layer. When a small region has a high resistance, it means that joule heat is increased in the small region, and thus, joule heat generated between the phase change layer 61 and the lower electrode contact layer 58 (or other layer below the phase change layer 61) is higher than a case without the fullerene layer 60. Further, because a thermal conductivity of the fullerene layer 60 is relatively low, loss of the generated heat can be reduced or minimized. Thus, when a current I is a reset current $I_{reset}$, even though the reset current $I_{reset}$ is reduced lower than the conventional reset current, joule heat is generated between the lower electrode contact layer 58 and the phase change layer 61 as much as the conventional joule heat. As a result, the contact portion of the phase change layer 61 with the fullerene layer 60 may be heated to a temperature higher than the phase change temperature, that is, a melting point, so as to be changed to an amorphous state.

As described above, it is acknowledged that the fullerene layer 60 functions as an element increasing a heating value and/or reducing a loss of heat, for example, a heat efficiency improving element. The heat efficiency improving element may be one selected from a group consisting of a carbon nanotube (CNT) layer, a nanoparticle layer, and a nanodot layer. The nanoparticle layer may be, for example, the fullerene layer 60. The fullerene 60f may be one of C60, C70, C76, C78, and C84. The fullerene layer 60 may be a metal endohedral layer including metal atoms thereinside. The metal atoms may be a Lathanide group comprising La, Er, Gd, Ho, and/or Nd. The nanoparticle layer or the nanodot layer may be composed of at least one of a silicon compound, a carbon compound, an oxygen compound (for example, an oxide), and a nitrogen compound.

A PRAM according to another example embodiment of the present invention will be explained.

Figure 3:
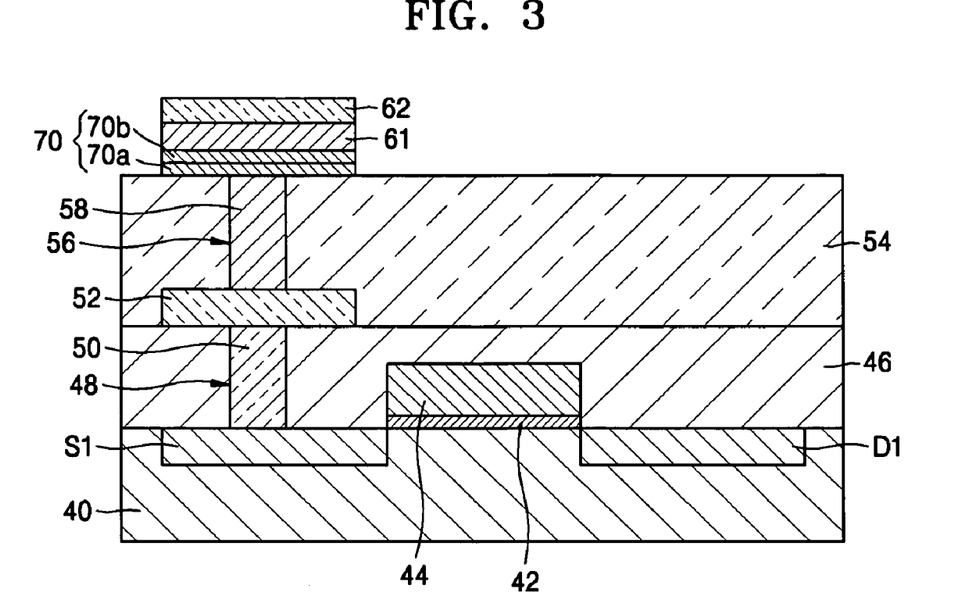
FIGS. 3 through 5 are sectional views illustrating PRAMs according to example embodiments of the present invention, respectively.

FIG. 3 is a sectional view of a PRAM (hereinafter, referred to as a 'second PRAM') according to another example embodiment of the present invention. Referring to FIG. 3, the second PRAM may be structured such that a heat efficiency improving element 70, for example, a carbon nanotube (CNT) layer, a nanoparticle layer, and/or a nanodot layer, is disposed on a second interlayer insulating layer 54 to cover an exposed upper surface of the lower electrode contact layer 58. The heat efficiency improving element 70 may include first and second fullerene layers 70a and 70b, which are sequentially stacked. In an example embodiment, the first and second fullerene layers 70a and 70b may include hollow spheres, ellipsoids, and/or tubes of carbon. The first fullerene layer 70a may be the fullerene layer 60 of the first PRAM. The second fullerene layer 70b may be the same as the first fullerene layer 70a, but may be different. For example, when the first fullerene layer 70a is a C60 layer, the second fullerene layer 70b may any one of a C60 layer, a C70 layer, a C76 layer, a C78 layer, and a C84 layer.

The fullerene layer 70 of the second PRAM may include three fullerene layers or more, and may include a total of twenty fullerene layers including the first and second fullerene layers 70a and 70b. When the fullerene layer 70 includes a plurality of fullerene layers, which are sequentially stacked as described above, a resistance of the current passing through the fullerene layer 70 is higher than a resistance of the current passing through the fullerene layer 60 as a single layer of the first PRAM. Thus, when the same current is applied to the first and second PRAMs, a heating value of the fullerene layer 70 of the second PRAM is higher than that of the fullerene layer 60 of the first PRAM. Thus, a reset current of the second PRAM is lower than a reset current of the first PRAM.

In experiment conducted, while the first PRAM having a single layer of the fullerene layer 60 had a reset current of ~0.4 mA, the second PRAM having a double layer of the fullerene layer 70 had a reset current of ~0.26 mA.

Apart from the fullerene layer 70 of the second PRAM being a double layer, other elements of the second PRAM may be the same as those of the first PRAM.

A PRAM according to another example embodiment of the present invention will be explained.

Figure 4:
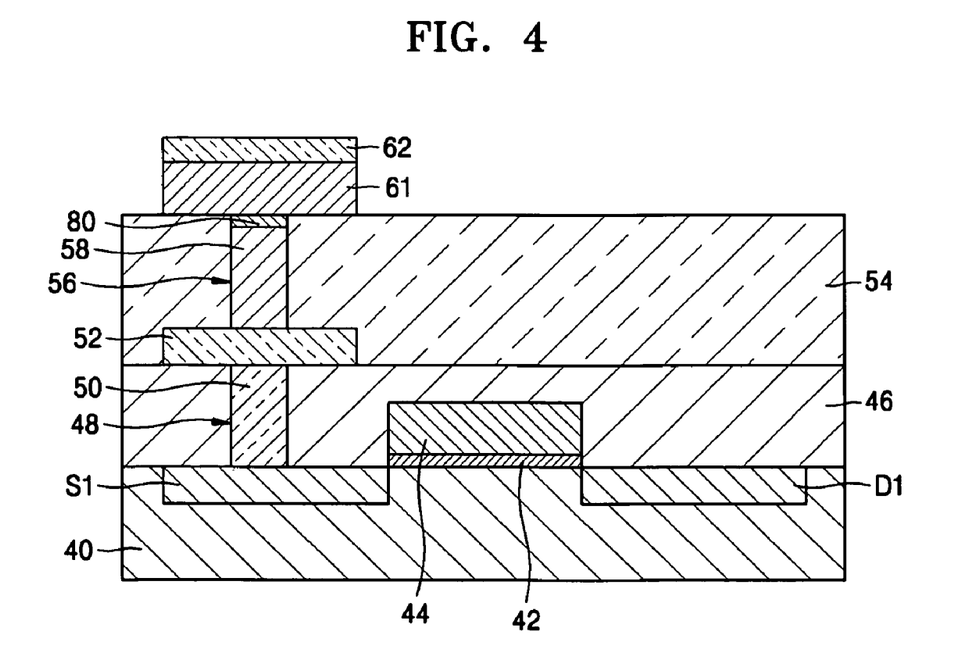

FIG. 4 is a sectional view of a PRAM (hereinafter, referred to as a 'third PRAM') according to another example embodiment of the present invention. Referring to FIG. 4 illustrating the third PRAM, a lower electrode contact layer 58 is disposed lower than an upper surface of a second interlayer insulating layer 54 by a given thickness while filling the second interlayer insulating layer 54. Thus, an upper portion of a via hole 56 is partially empty as much as the given thickness, and the empty upper portion of the via hole 56 is filled with a heat efficiency improving element 80, for example, a carbon nanotube (CNT) layer, a nanoparticle layer, and/or a nanodot layer. In an example embodiment, the heat efficiency improving element 80 may be a fullerene layer that may include hollow spheres, ellipsoids, and/or tubes of carbon. A phase change layer 61 is formed on the second interlayer insulating layer 54 to cover an upper surface of the heat efficiency improving element 80. The heat efficiency improving element 80 may be the same as the fullerene layer 60 of the first PRAM. Other elements of the third PRAM may be the same as those of the first PRAM.

A PRAM according to another example embodiment of the present invention will be explained.

Figure 5:
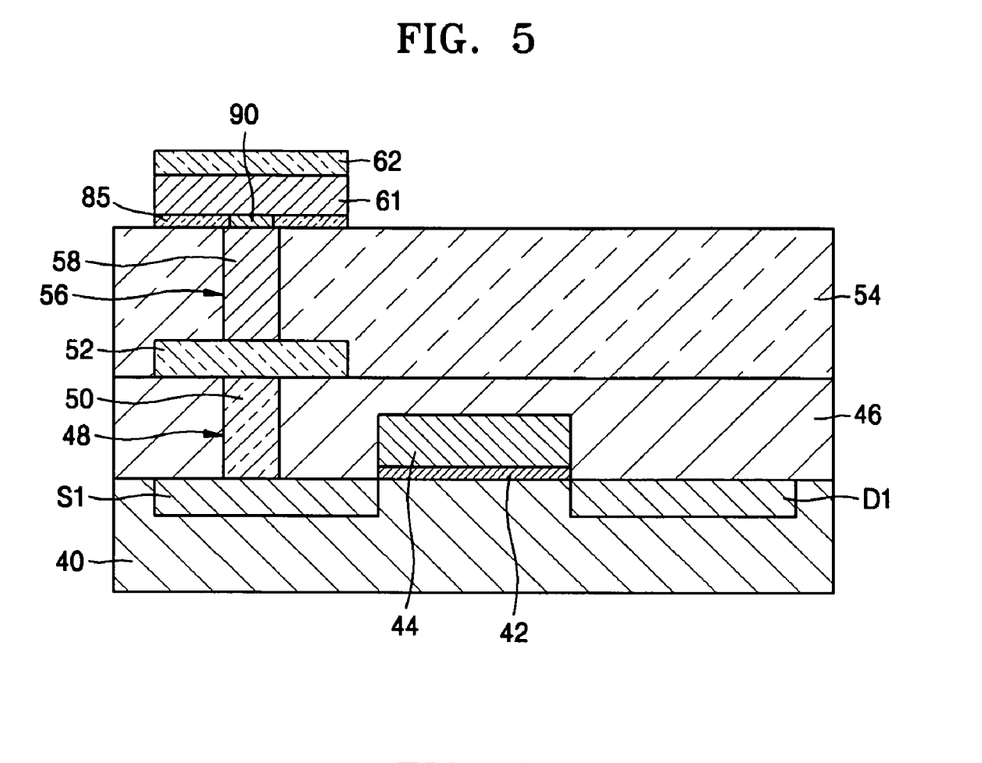

FIG. 5 is a sectional view of a PRAM (hereinafter, referred to as a 'fourth PRAM') according to another example embodiment of the present invention. In the fourth PRAM, an insulating layer 85 is disposed on a second interlayer insulating layer 54. The insulating layer 85 may be, for example, a silicon dioxide layer ($SiO_2$). The insulating layer 85 partially or fully covers an upper surface of a lower electrode contact layer 58. That is, the insulating layer 85 confines an exposed surface of the lower electrode contact layer 58. A remaining portion of the upper surface of the lower electrode contact layer 58, which is not covered with the insulating layer 85, is covered with a heat efficiency improving element 90, which may be a fullerene layer that may include hollow spheres, ellipsoids, and/or tubes of carbon. The fullerene layer 90 is a heat efficiency improving element, and, for example, may be one of a C60 layer, a C70 layer, a C76 layer, a C78 layer, and a C84 layer. A phase change layer 61 is formed on the insulating layer 85 to cover the fullerene layer 90. Other elements of the fourth PRAM may be the same as those of the first PRAM.

Figure 6:
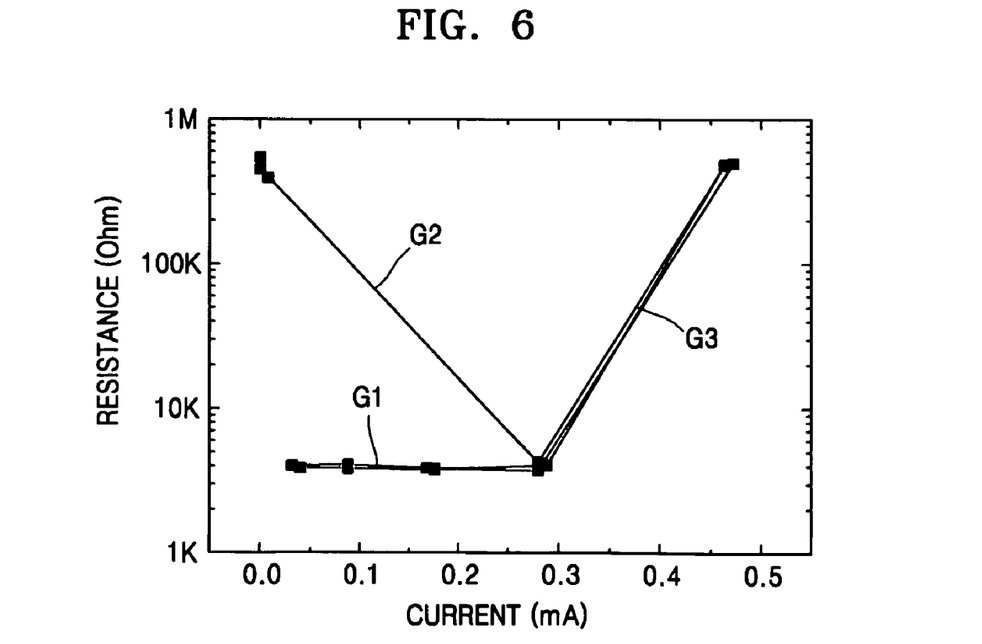
FIG. 6 is a graph illustrating resistance-current characteristics of a PRAM according to an example embodiment of the present invention.

Resistance-current characteristics of a PRAM according to an example embodiment of the present invention will be explained. FIG. 6 illustrates a change of a resistance in accordance with an applied current when the phase change layer 61 of the first through fourth PRAMs has a crystal structure and an amorphous structure respectively.

In FIG. 6, a first graph G1 and a third graph G3 illustrate resistance-current characteristics when the phase change layer 61 of the PRAM according to an example embodiment of the present invention initially has a crystal structure. A second graph G2 illustrates resistance-current characteristics when the phase change layer 61 of the PRAM according to an example embodiment of the present invention initially has an amorphous structure.

Referring to the first and third graph G1 and G3, when the phase change layer 61 of the PRAM according to an example embodiment of the present invention has an initial crystal structure, a resistance of the PRAM maintains a low value until current, that is, a current of 0.3 mA is applied, so that the resistance is not significantly changed. However, when the current becomes 0.5 mA, a resistance of the PRAM is significantly increased. This means that a phase change occurs from a crystal structure to an amorphous structure when 0.4 mA of a current pulse is applied. Therefore, a reset current is 0.4 mA.

Referring to the second graph G2, it is acknowledged that a resistance of the PRAM, which is high in an initial amorphous state, is gradually decreased when a current pulse is applied. When 0.3 mA of a current pulse is applied, the phase change layer 61, which is in an initial amorphous state, is changed completely to a crystal structure, so that a resistance of the PRAM becomes equal to the resistance when the phase change layer 61 is in an initial crystal state. When an applied current is continuously increased to 0.3 mA or higher, the phase change layer 61, which has been changed from an amorphous structure to a crystal structure, is changed again to the amorphous structure so that a resistance of the PRAM is increased.

Figure 7:
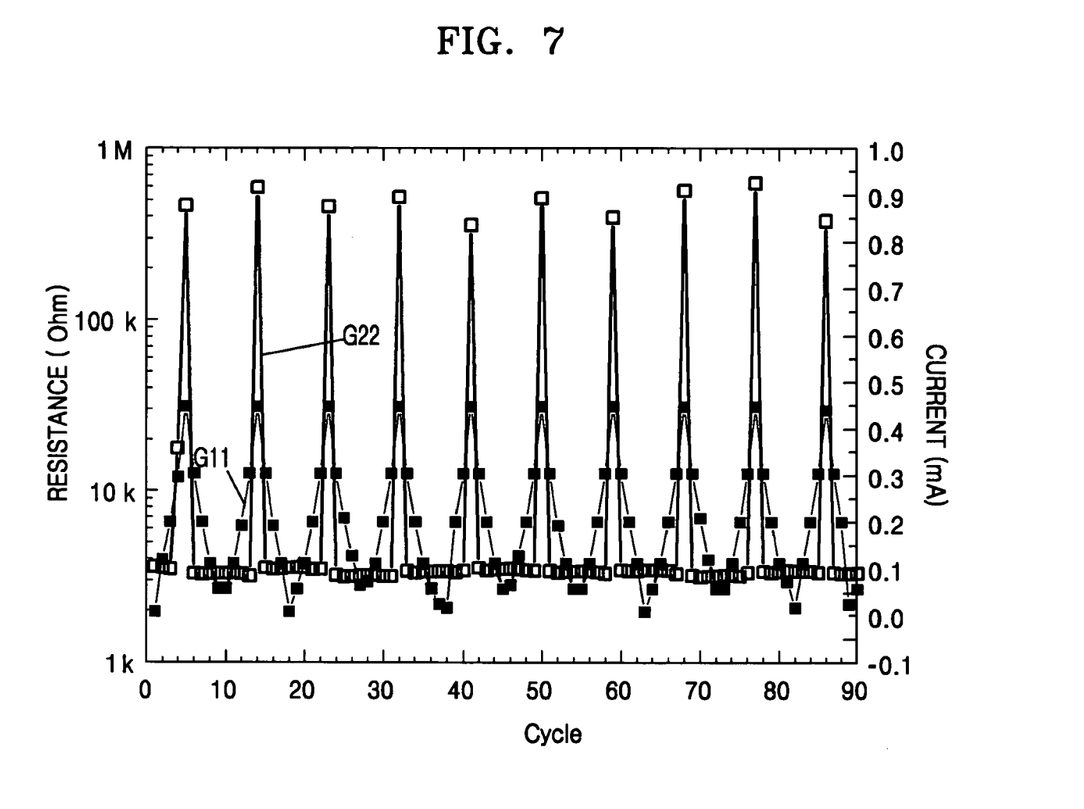
FIG. 7 is a graph illustrating resistance-current characteristics of a PRAM according to an example embodiment of the present invention.

FIG. 7 illustrates a change pattern of resistances of a PRAM according to an example embodiment of the present invention when a reset current and a set current are repeatedly applied to the PRAM in the same pattern.

In FIG. 7, a first graph G11 illustrates a current applied to the PRAM, and a second graph G22 illustrates a resistance of the PRAM measured after a current is applied.

Referring to the first and second graph G11 and G22 of FIG. 7, a current is repeatedly applied in accordance with a given pattern (hereinafter, current applied pattern), and a resistance of the PRAM measured as a result has a repeated pattern (hereinafter, resistance pattern). It is acknowledged that the resistance patterns are equal, and a resistance pattern period and an applied current pattern period correspond. Further, from the view of the resistance patterns, because minimum values and maximum values of resistances are almost equal, a deviation between the resistance patterns is not so high. The result means that when minimum resistance values and maximum resistance values are measured repeatedly under the same conditions in the PRAM according to an example embodiment of the present invention, minimum resistance values and maximum resistance values are constant within a permissible deviation, and a difference between minimum resistance values and maximum resistance values is constant within a permissible deviation, and also means that a reproducibility of the PRAM of example embodiments of the present invention is excellent.

A method of operating the first PRAM according to an example embodiment of the present invention as described above will be explained. The method may be similarly applied to the second through fourth PRAMs.

Figure 8:
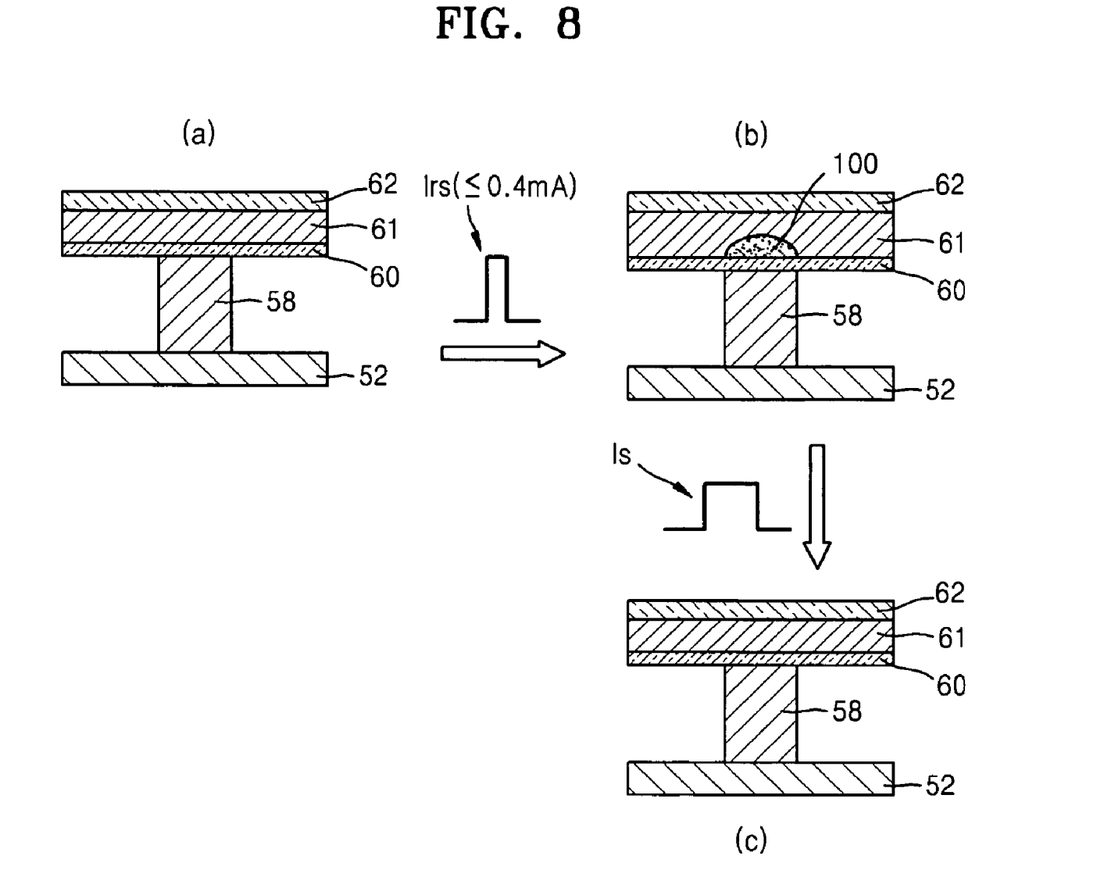
FIGS. 8(A) to 8(C) show sectional views illustrating a method of operating a PRAM according to an example embodiment of the present invention.

Because a transistor is always in an on state for the operating method of the present invention, a switching element is not illustrated in FIGS. 8(A) to 8(C) for convenience.

As illustrated in FIG. 8(A), a current of a reset current $I_{rs}$ or higher is applied to a phase change layer 61 totally in a crystal structure for a desired time. For example, the reset current in the example embodiment of the present invention illustrated in FIG. 6 is about 0.4 mA. A heating efficiency right below the phase change layer 61 is increased more significantly than that of the case in a conventional PRAM because of a presence of a fullerene layer 60. Thus, significant heat is generated in the fullerene layer 60, and a temperature of a portion of the phase change layer 61 in contact with the fullerene layer 60 is changed to a phase change temperature or higher momentarily due to the generated heat. As a result, as illustrated in FIG. 8(B), an amorphous region 100 is formed in the phase change layer 61. When the amorphous region 100 is formed in the phase change layer 61, an electrical resistance of the phase change layer 61 is increased.

As such, it is assumed that data 1 is recorded to a PRAM of an example embodiment the present invention when the amorphous region 100 is formed in the phase change layer 61. Further, it is assumed that data 0 is recorded to a PRAM of an example embodiment of the present invention when a partial portion of the phase change layer 61 has a crystal structure.

As illustrated in FIG. 8(B), a set current $I_s$, which is smaller in intensity than the reset current $I_{rs}$, is applied to the phase change layer 61 when the amorphous region 100 is present in the phase change layer 61. At this time, the set current Is is applied for a longer time than that of the reset current $I_{rs}$.

As the set current Is is applied, the amorphous region 100 of the phase change layer 61 is changed to a crystal structure. Then, as illustrated in FIG. 8(C), the phase change layer 61 is totally changed to a crystal structure. The respective states of the phase change layer 61 illustrated in FIGS. 8(C) and (A) are the same. Thus, a process of applying the set current Is to the phase change layer 61 illustrated in FIG. 8(B) may be regarded as a process of removing data 1 recorded in the phase change layer 61, or a process of recording data 0 to the phase change layer 61.

A read current by which a phase of the phase change layer 61 is not changed is applied to both ends of a storage node including the phase change layer 61 so as to measure a resistance. The resistance measured as above is compared to a reference resistance to read out whether the data bit recorded to the phase change layer 61 is 1 or 0.

Thus, the read current applied to the phase change layer 61 may be lower than the reset current $I_{rs}$ and the set current Is.

As described above, when a current, which is applied to the phase change layer of the PRAM according to example embodiments of the present invention, passes through a heat efficiency improving element, a temperature of a portion of the phase change layer in contact with the heat efficiency improving element becomes a melting point of the phase change layer or higher even at a current lower than that of the conventional case due to a high resistivity and/or a low heat conductivity of a heat efficiency improving element, and the portion of the phase change layer in contact with the heat efficiency improving element becomes amorphous. Thus, the reset current in the PRAM of an example embodiment of the present invention can be decreased below that of a conventional PRAM. As such, when the reset current is decreased, because a size of a transistor can be reduced in accordance with the lower reset current, an integration density of the PRAM can be also increased.

While many specific examples have been described above, they may be understood as examples of the embodiments of the present invention rather than limiting the range of the present invention. For example, it will be well understood to those skilled in the art that an upper electrode contact layer having the same shape as that of the lower electrode contact layer 58 may be provided between the phase change layer 61 and the upper electrode 62. Further, a heat efficiency improving element, for example, the fullerene layer 60 may be also provided between the upper electrode contact layer and the phase change layer 61. The fullerene layer 60 may be provided between the lower electrode contact layer 58 and the phase change layer 61, and/or between the upper electrode 62 and the upper electrode contact layer selectively. Further, along with the formation of the fullerene layer 60, the phase change layer 61 itself may be changed, or the lower electrode contact layer 58 itself may be changed. Therefore, the scope of the present invention may be determined by the technical spirit disclosed in the claims rather than limited by the embodiments explained as above.

Further, example embodiments of the present invention, particularly those illustrated in FIGS. 1, 3, 4, and 5, contain several features and several combinations of features. However, these combinations of features are not meant to be exhaustive, and all possible combinations of features are considered to be with the scope of the present invention. For example, the embodiment of FIG. 3 illustrates multiple heat efficiency improving elements and the embodiment of FIG. 4 illustrates a recessed heat efficiency improving element. An example embodiment including multiple recessed heat efficiency improving element is also considered to be with the scope of the present invention. Similarly, the embodiment of FIG. 3 illustrates multiple heat efficiency improving elements and the embodiment of FIG. 5 illustrates a heat efficiency improving element and an insulating layer. An example embodiment including a recessed heat efficiency improving element and a recessed insulating layer is also considered to be with the scope of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change random access memory (PRAM) comprising:
 a storage node connected to a switching element, the storage node including
 a first electrode;
 a phase change layer;
 a heat efficiency improving element formed between the first electrode and the phase change layer; and
 a second electrode,
 wherein the heat efficiency improving element is one of a carbon nanotube (CNT) layer, a nanoparticle layer, and a nanodot layer.

2. The PRAM of claim 1, wherein the heat efficiency improving element comprises at least two layers which are sequentially stacked.

3. The PRAM of claim 1, wherein the nanoparticle layer is a fullerene layer.

4. The PRAM of claim 3, wherein the fullerene layer is one of a C60 layer, a C70 layer, a C76 layer, a C78 layer, and a C84 layer.

5. The PRAM of claim 3, wherein the fullerene layer is a metal endohedral layer comprising metal atoms thereinside.

6. The PRAM of claim 5, wherein the metal atoms are of a Lanthanide group comprising at least one of La, Er, Gd, Ho, and Nd.

7. The PRAM of claim 1, wherein the nanoparticle layer or the nanodot layer is composed of at least one of a silicon compound, a carbon compound, an oxygen compound, and a nitrogen compound.

8. The PRAM of claim 1, wherein the heat efficiency improving element extends to an entire surface of the phase change layer.

9. The PRAM of claim 1, wherein the storage node further comprises a first electrode contact layer formed on the first electrode, and the heat efficiency improving element is disposed in contact with the first electrode contact layer.

10. The PRAM of claim 9, wherein the heat efficiency improving element is disposed in contact with the first electrode contact layer, and another portion of the upper surface of the first electrode contact layer is in contact with an insulating layer.

11. The PRAM of claim 9, wherein the heat efficiency improving element is disposed inside the first electrode contact layer with a predetermined depth downward from the upper surface of the first electrode contact layer, and contacts the phase change layer.

12. The PRAM of claim 1, wherein the storage node comprises a plurality of layers.

* * * * *